US009640480B2

(12) United States Patent
Gupta et al.

(10) Patent No.: US 9,640,480 B2
(45) Date of Patent: May 2, 2017

(54) CROSS-COUPLE IN MULTI-HEIGHT SEQUENTIAL CELLS FOR UNI-DIRECTIONAL M1

(71) Applicant: QUALCOMM Incorporated, San Diego, CA (US)

(72) Inventors: Mukul Gupta, San Diego, CA (US); Xiangdong Chen, San Diego, CA (US); Ohsang Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/723,357

(22) Filed: May 27, 2015

(65) Prior Publication Data

US 2016/0351490 A1 Dec. 1, 2016

(51) Int. Cl.
| H01L 23/528 | (2006.01) |
| H01L 27/088 | (2006.01) |
| G06F 1/10 | (2006.01) |
| G06F 17/50 | (2006.01) |
| H01L 27/02 | (2006.01) |
| H01L 27/118 | (2006.01) |

(52) U.S. Cl.
CPC ............. *H01L 23/528* (2013.01); *G06F 1/10* (2013.01); *G06F 17/5068* (2013.01); *H01L 27/0207* (2013.01); *H01L 27/088* (2013.01); *H01L 27/11807* (2013.01); *H01L 23/5286* (2013.01); *H01L 2027/11875* (2013.01); *H01L 2027/11879* (2013.01)

(58) Field of Classification Search
CPC .. H01L 23/528; H01L 23/5283; H01L 27/088
See application file for complete search history.

(56) References Cited

U.S. PATENT DOCUMENTS

| 8,533,641 B2 * | 9/2013 | Park .................. H01L 27/11807 716/50 |
| 8,924,908 B2 | 12/2014 | Kawa et al. |
| 8,941,150 B2 | 1/2015 | Sherlekar et al. |
| 9,009,641 B2 | 4/2015 | Becker et al. |
| 2005/0114820 A1 | 5/2005 | Restle |

(Continued)

OTHER PUBLICATIONS

International Search Report and Written Opinion—PCT/US2016/025388—ISA/EPO—Jun. 23, 2016.

*Primary Examiner* — Jeffrey Zweizig
(74) *Attorney, Agent, or Firm* — Arent Fox LLP

(57) ABSTRACT

A MOS device includes first, second, third, and fourth interconnects. The first interconnect extends on a first track in a first direction. The first interconnect is configured in a metal layer. The second interconnect extends on the first track in the first direction. The second interconnect is configured in the metal layer. The third interconnect extends on a second track in the first direction. The third interconnect is configured in the metal layer. The second track is parallel to the first track. The third interconnect is coupled to the second interconnect. The second and third interconnects are configured to provide a first signal. The fourth interconnect extends on the second track in the first direction. The fourth interconnect is configured in the metal layer. The fourth interconnect is coupled to the first interconnect. The first and fourth interconnects are configured to provide a second signal different than the first signal.

30 Claims, 6 Drawing Sheets

(56) References Cited

U.S. PATENT DOCUMENTS

| | | |
|---|---|---|
| 2007/0157144 A1 | 7/2007 | Mai et al. |
| 2009/0140800 A1* | 6/2009 | Hillman ................. G06F 1/3203 327/566 |
| 2013/0021076 A1 | 1/2013 | Kuenemund et al. |
| 2014/0246733 A1 | 9/2014 | Becker et al. |
| 2015/0048425 A1 | 2/2015 | Park et al. |
| 2015/0054568 A1 | 2/2015 | Rasouli et al. |
| 2015/0123730 A1* | 5/2015 | Yang ................... H01L 27/0207 327/566 |

* cited by examiner

US 9,640,480 B2

CROSS-COUPLE IN MULTI-HEIGHT SEQUENTIAL CELLS FOR UNI-DIRECTIONAL M1

BACKGROUND

Field

The present disclosure relates generally to a cross-couple structure in multi-height sequential cells for uni-directional M1.

Background

As semiconductor devices are fabricated at smaller sizes, manufacturers of semiconductor devices are finding it more difficult to integrate larger amounts of devices on a single chip. Furthermore, modern processing technologies are imposing a greater number of restrictions with respect to semiconductor device layout designs, which may cause certain semiconductor layout designs to consume a large amount of area on a metal oxide semiconductor (MOS) device. As such, improvements to semiconductor layout designs are needed to overcome such restrictions.

SUMMARY

In an aspect of the disclosure, a MOS device includes first, second, third, and fourth interconnects. The first interconnect extends on a first track in a first direction. The first interconnect is configured in a metal layer. The second interconnect extends on the first track in the first direction. The second interconnect is configured in the metal layer. The third interconnect extends on a second track in the first direction. The third interconnect is configured in the metal layer. The second track is parallel to the first track. The third interconnect is coupled to the second interconnect. The second and third interconnects are configured to provide a first signal. The fourth interconnect extends on the second track in the first direction. The fourth interconnect is configured in the metal layer. The fourth interconnect is coupled to the first interconnect. The first and fourth interconnects are configured to provide a second signal different than the first signal.

In an aspect of the disclosure, in a MOS device, a first signal is propagated through a first interconnect extending on a first track in a first direction. The first interconnect is configured in a metal layer. In addition, a second signal is propagated through a second interconnect extending on the first track in the first direction. The second interconnect is configured in the metal layer. The second signal is different than the first signal. In addition, the first signal is propagated through a third interconnect extending on a second track in the first direction. The third interconnect is configured in the metal layer. The second track is parallel to the first track. The third interconnect is coupled to the second interconnect. Furthermore, the second signal is propagated through a fourth interconnect extending on the second track in the first direction. The fourth interconnect is configured in the metal layer. The fourth interconnect is coupled to the first interconnect.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
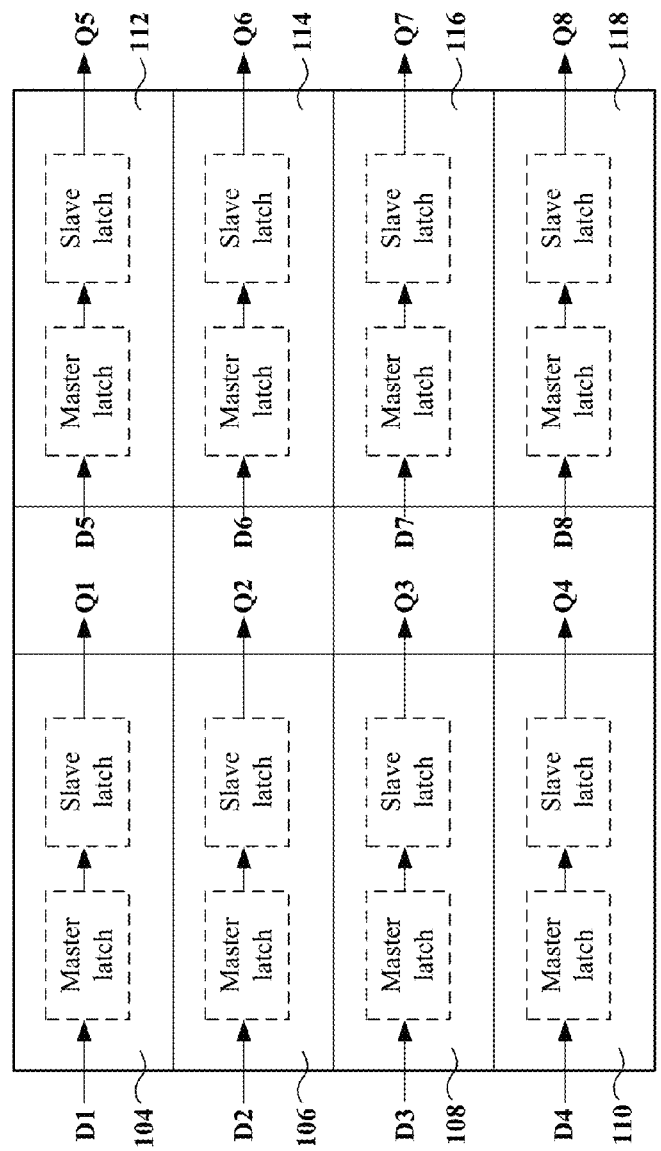
FIG. 1 is a diagram illustrating a multi-bit flip-flop tray.

FIG. 1 is a diagram illustrating a multi-bit flip-flop tray 100. As shown in FIG. 1, multi-bit flip-flop tray 100 includes single bit flip-flops 104, 106, 108, 110, 112, 114, 116, and 118. As further shown in FIG. 1, each flip-flop (which may be referred to as a sequential logic cell) in the multi-bit flip-flop tray 100 includes a master latch and a slave latch. In an aspect, each master latch is configured to receive an input D of a flip-flop (e.g., D1 of flip-flop 104) and each slave latch is configured to provide an output Q of the flip-flop (e.g., Q1 of flip-flop 104). The multi-bit flip-flop tray 100 may be configured on a MOS device as an arrangement of eight single-row cells.

Figure 2:
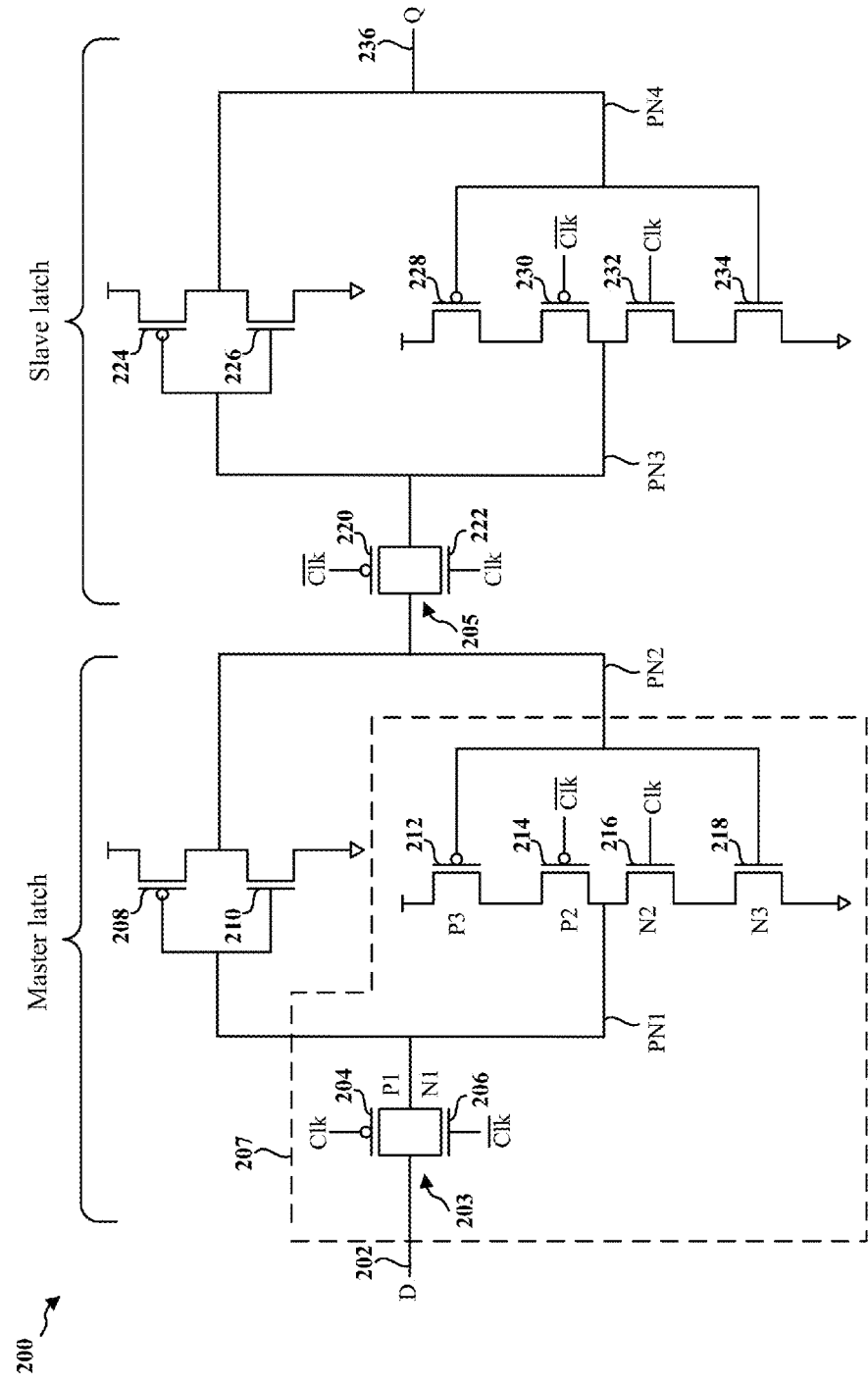
FIG. 2 is a diagram illustrating a single bit flip-flop circuit.

FIG. 2 is a diagram illustrating a single bit flip-flop circuit 200. In an aspect, the flip-flop circuit 200 of FIG. 2 represents a transistor level implementation of a flip-flop in the multi-bit flip-flop tray 100 (e.g., single bit flip-flop 104). As shown in FIG. 2, flip-flop circuit 200 includes a mater latch and a slave latch. As shown in FIG. 2, the master latch includes N-type transistors 206, 210, 216, and 218, and P-type transistors 204, 208, 212, 214. As further shown in FIG. 2, the slave latch includes N-type transistors 222, 226, 232, and 234, and P-type transistors 220, 224, 228, and 230.

An example operation of the single bit flip-flop circuit 200 will now be discussed. An input value D may be provided to input 202 of the master latch. When the clock signal (Clk) is a logic '0', the transmission gate 203 (e.g., P-type transistor ("P1") 204 and N-type transistor ("N1") 206) will turn on and allow the value D to appear at node PN1. When the clock signal transitions to a logic '1', the value D will be latched at node PN1 (and the inverse of the value D will be latched at node PN2). While the clock signal is a logic '1', the transmission gate 205 (e.g., P-type transistor 220 and N-type transistor 222) will turn on and allow the inverse of value D at PN2 to appear at node PN3 and allow the value D to appear at the node PN4. When the clock signal (Clk) transitions from logic '1' to logic '0', the transmission gate 205 will turn off and the value D will be latched at node PN4. The value D is then provided at output Q 236.

Figure 3:
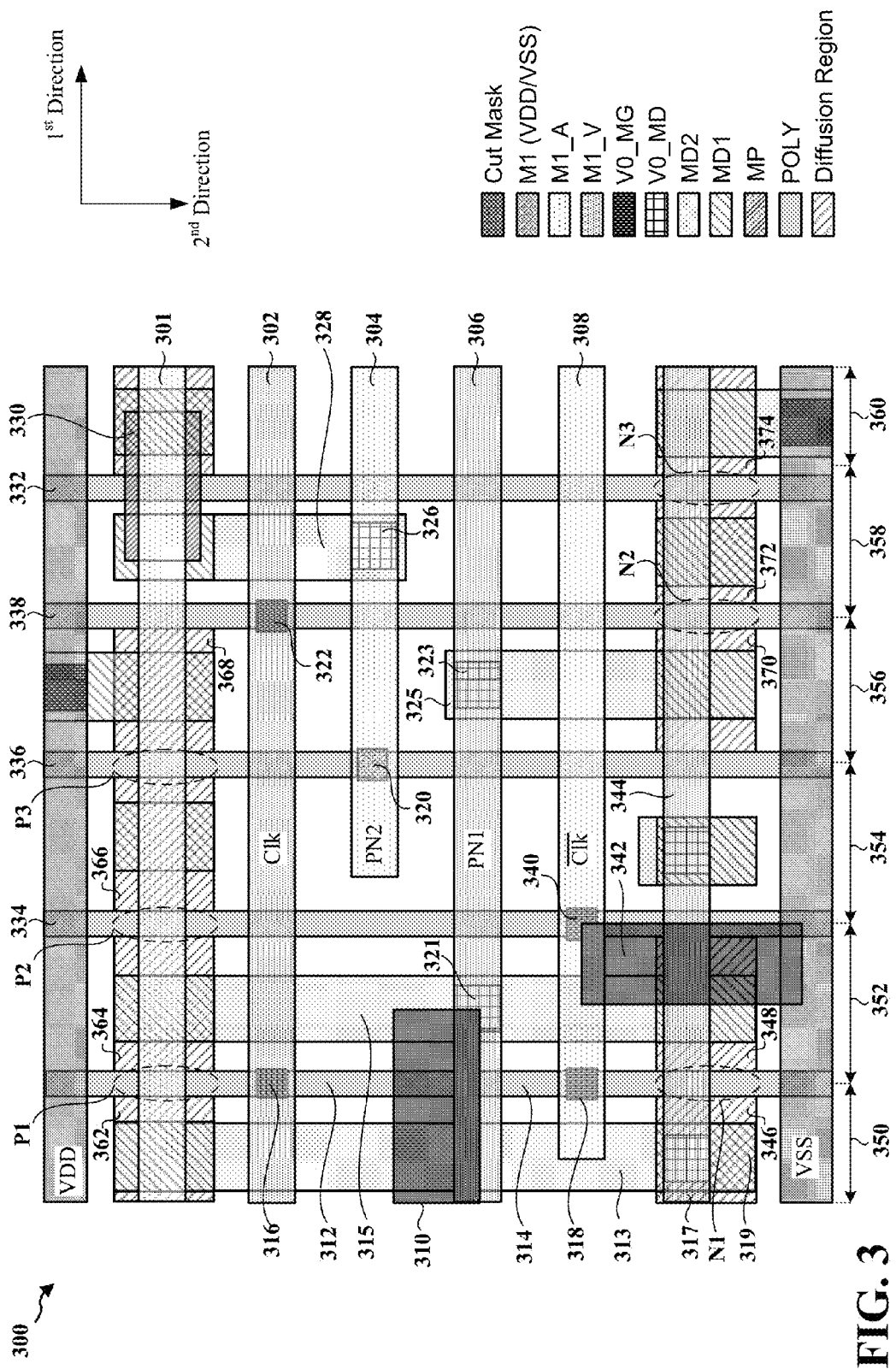
FIG. 3 is a top view of an exemplary layout diagram for a MOS device.

FIG. 3 is a top view of an exemplary layout diagram for a MOS device 300. With reference to FIG. 2, the layout diagram is an implementation of portion 207 of the single bit flip-flop circuit 200. It should be understood that the diagram in FIG. 3 is a representation of the various masks that may be used for fabricating the features of the MOS device 300. For example, each mask may correspond to various features that are to be configured in a particular layer (e.g., interconnects, vias, etc.) of the MOS device 300. Therefore, the diagram in FIG. 3 concurrently shows a number of layers of the MOS device 300 in an overlaid manner for ease of illustration and understanding of the disclosure.

As shown in FIG. 3, MOS device 300 includes P diffusion regions 362, 364, 366, and 368, and N diffusion regions 346, 348, 370, 372, and 374. MOS device 300 further includes gate interconnects 312, 314, 332, 334, 336, and 338. The gate interconnects may be configured in a POLY layer and may be referred to as POLY interconnects. In some process technologies, gate interconnects may be formed of metal. However, in other process technologies, gate interconnects may be entirely polysilicon or may be polysilicon with a metal top layer. In the configuration of FIG. 3, the gate interconnects 312, 334, and 336 correspond to respective pMOS transistors P1, P2, and P3. The gate interconnects 314, 338, and 332 correspond to respective nMOS transistors N1, N2, and N3. The gate interconnects 312, 334, 336, 314, 338, and 332 extend in a second direction as indicated in the top right corner of FIG. 3. In the exemplary configuration of FIG. 3, the gate interconnects 312, 334, 336, 314, 338, and 332 are configured as transistor gates. For example, gate interconnect 312 is configured as a transistor gate for pMOS transistor P1, gate interconnect 314 is configured as a transistor gate for nMOS transistor N1, gate interconnect 334 is configured as a transistor gate for pMOS transistor P2, gate interconnect 336 is configured as a transistor gate for pMOS transistor P3, gate interconnect 338 is configured as a transistor gate for nMOS transistor N2, and gate interconnect 332 is configured as a transistor gate for nMOS transistor N3.

As shown in FIG. 3, the MOS device 300 further includes M1 layer interconnects 301, 302, 304, 306, 308, 317, and 344 in the M1 layer. As shown in FIG. 3, the M1 layer interconnects 301, 302, 304, 306, 308, 317, and 344 extend in the first direction. In an aspect, the M1 layer interconnects 301, 304, and 308 are formed using a first mask and are referred to as M1_A layer interconnects. In such aspect, the M1 layer interconnects 302, 306, 317, and 344 are formed using a second mask and are referred to as M1_V layer interconnects. In the configuration of FIG. 3, the M1 layer interconnect 302 is coupled to the gate interconnect 312 through via (V0_MG) 316. In the aspects disclosed herein, the term V0_MG refers to a via that is formed using metal and that couples an interconnect in a metal layer to an interconnect in a POLY layer. The M1 layer interconnect 302 is further coupled to the gate interconnect 338 through via (V0_MG) 322. The M1 layer interconnect 304 is coupled to the gate interconnect 336 through via (V0_MG) 320. The M1 layer interconnect 308 is coupled to the gate interconnect 314 through via (V0_MG) 318. The M1 layer interconnect 308 is further coupled to the gate interconnect 334 through via (V0_MG) 340. Therefore, in FIG. 3, it should be understood that the vias (V0_MG) 316, 318, 320, 322, and 340 are situated above the POLY layer and below the M1 layer.

As shown in FIG. 3, the MOS device 300 further includes metal diffusion two (MD2) layer interconnects 313, 315, and 328 configured in the MD2 layer. As shown in FIG. 3, the MD2 layer interconnects 313, 315, and 328 extend in the second direction. In an aspect, the MD2 layer is situated below the M1 layer and above the POLY layer. As shown in FIG. 3, the MD2 layer interconnect 313 is coupled to the source (e.g., diffusion region 362) of transistor P1 and the drain (e.g., diffusion region 346) of transistor N1. The MD2 layer interconnect 313 may be coupled to the drain of transistor N1 (e.g., diffusion region 346) through a metal diffusion one (MD1) layer interconnect (e.g., MD1 layer interconnect 319). The MD1 layer is at the same height as the POLY layer. As further shown in FIG. 3, the MD2 layer interconnect 315 is coupled to the drain (e.g., diffusion region 364) of transistor P1 and the source (e.g., diffusion region 348) of transistor N1. As the diffusion region 364 is also the drain of the transistor P2, the MD2 layer interconnect 315 couples the drains of the transistors P1 and P2 to the source of the transistor N1. The MD2 layer interconnect 315 is further coupled to the M1 layer interconnect 306 through via (V0_MD) 321. In the aspects disclosed herein, the term V0_MD refers to a via that is formed using metal and that couples an interconnect in an MD layer (e.g., MD2 layer) to an interconnect in a metal layer. The MD2 layer interconnect 325 is coupled to the M1 layer interconnect 306 through via (V0_MD) 323 and is further coupled to the drain (e.g., diffusion region 370) of transistor N2. The MD2 layer interconnect 328 is coupled to the M1 layer interconnect 304 through via (V0_MD) 326 and is further coupled to the gate interconnect 332 via metal POLY (MP) layer interconnect 330 situated in the MP layer above the gate interconnect 332. The MP layer is at the same height as the MD2 layer. As such, the MD2 layer interconnect 328 and the MP layer interconnect 330 abut together to form a connection.

In the aspect of FIG. 3, gate interconnect 312 is electrically isolated from gate interconnect 314 by configuring a single gate interconnect and by applying a cut mask portion 310. The cut mask portion 310 is configured to cut the single gate interconnect to effectively form two electrically isolated gate interconnects. Moreover, the M1 layer interconnect 317 is electrically isolated from the M1 layer interconnect 344 by configuring a single M1 layer interconnect and by applying a cut mask portion 342. The cut mask portion 342 is configured to cut the single M1 layer interconnect to effectively form two electrically isolated M1 layer interconnects.

In the example configuration of FIG. 3, an input value D (e.g., logic '1' or logic '0') may be provided to M1 layer interconnect 317. As shown in FIG. 3, the M1 layer interconnect 302 is configured to carry a clock signal (Clk), and the M1 layer interconnect 308 is configured to carry the inverse Clk of the clock signal. With reference to FIG. 2, the M1 layer interconnect 306 corresponds to the node PN1, and the M1 layer interconnect 304 corresponds to the node PN2.

As shown in FIG. 3, the area consumed on the MOS device may be represented in grid units, such as grid units 350, 352, 354, 356, 358, and 360. In the example configuration of FIG. 3, each of the grid units 350, 352, 354, 356, 358, and 360 indicates the spacing required between two adjacent gate interconnects. In an aspect, the grid units 350, 352, 354, 356, 358, and 360 are substantially equal. Therefore, in the example configuration of FIG. 3, the MOS device consumes six grid units (e.g., grid units 350, 352, 354, 356, 358, and 360). With six grid units, there are six gate interconnects within the cell. The six gate interconnects include the gate interconnects 312/314, 334, 336, 338, 332, and two half gate interconnects (not shown) on each side of the cell.

Figure 4:
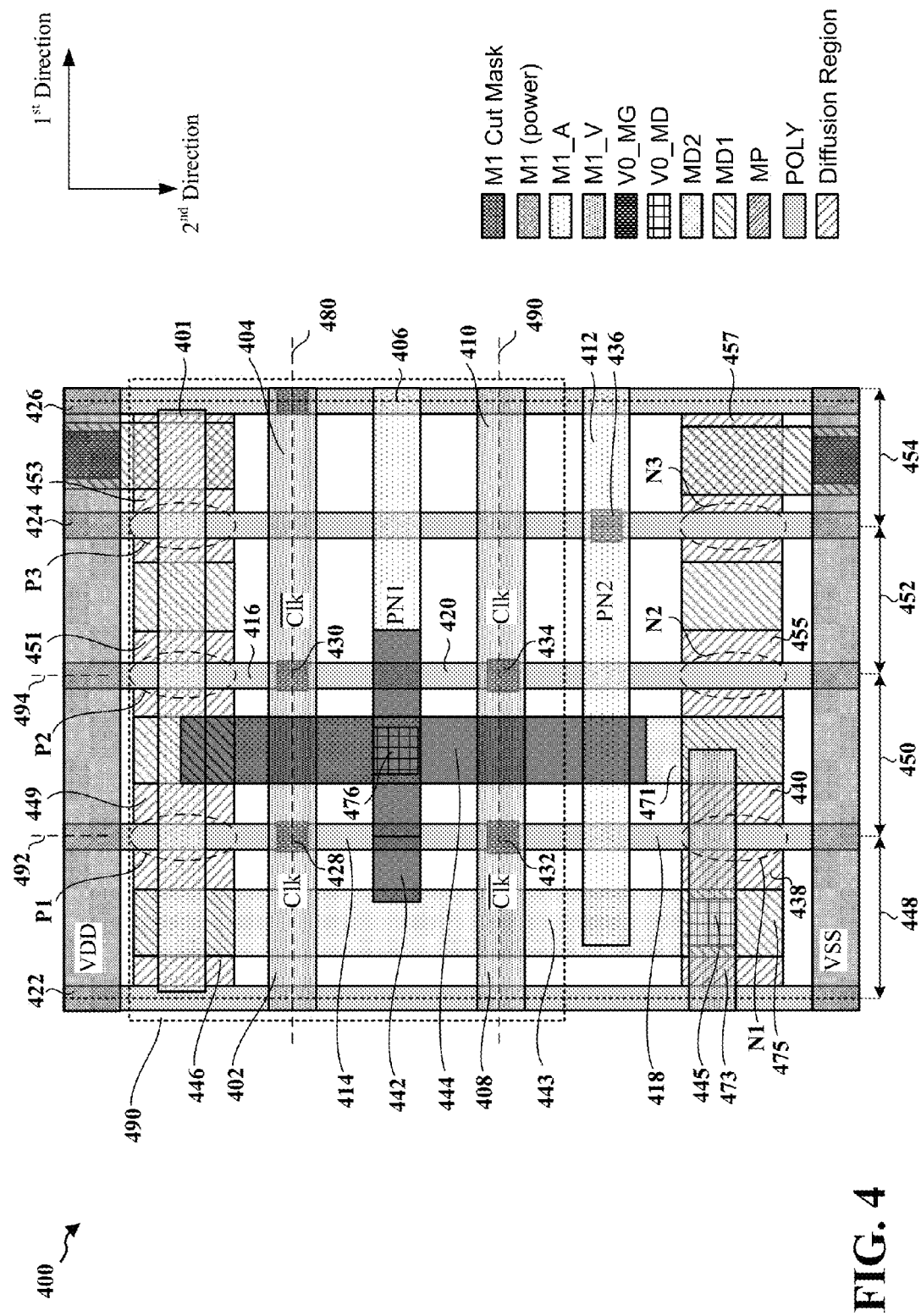
FIG. 4 is a top view of an exemplary layout diagram for a MOS device in accordance with various aspects of the disclosure.

FIG. 4 is a top view of an exemplary layout diagram for a MOS device 400 in accordance with various aspects of the disclosure. Similar to the layout diagram of FIG. 3, the layout diagram of FIG. 4 is an implementation of portion 207 of the single bit flip-flop circuit 200 of FIG. 2. Therefore, the layout diagram of FIG. 4 performs the same functionality as the layout diagram of FIG. 3. It should be understood that the diagram in FIG. 4 is a representation of the various masks that may be used for fabricating the features of the MOS device 400. For example, each mask may correspond to various features that are to be configured in a particular layer (e.g., interconnects, vias, etc.) of the MOS device 400. Therefore, the diagram in FIG. 4 concurrently shows a number of layers of the MOS device 400 in an overlaid manner for ease of illustration and understanding of the disclosure.

As shown in FIG. 4, MOS device 400 includes P diffusion regions 446, 449, 451, and 453, and N diffusion regions 438, 440, 455, and 457. MOS device 400 further includes gate interconnects 414, 416, 418, 420, and 424. On edges of the cell, the MOS device 400 includes half-width gate interconnects 422 and 426. As further shown in FIG. 4, the gate interconnects 414 and 418 extend along a track 492 in the second direction, and the gate interconnects 416 and 420 extend along a track 494 in the second direction, where the track 492 is parallel to the track 494.

The gate interconnects may be configured in a POLY layer and may be referred to as POLY interconnects. In the configuration of FIG. 4, the gate interconnects 414 and 416 correspond to respective pMOS transistors P1 and P2. The gate interconnects 418 and 420 correspond to respective nMOS transistors N1 and N2. The gate interconnect 424 corresponds to pMOS transistor P3 and nMOS transistor N3. The gate interconnects 414, 416, 418, 420, 422, 424, and 426 extend in a second direction as indicated in the top right corner of FIG. 4. In the exemplary configuration of FIG. 4, the gate interconnects 414, 416, 418, 420, and 424 are configured as transistor gates. For example, gate interconnect 414 is configured as a transistor gate for pMOS transistor P1, gate interconnect 418 is configured as a transistor gate for nMOS transistor N1, gate interconnect 416 is configured as a transistor gate for pMOS transistor P2, gate interconnect 420 is configured as a transistor gate for nMOS transistor N2, gate interconnect 424 is configured as a transistor gate for pMOS transistor P3 and nMOS transistor N3.

As shown in FIG. 4, the MOS device 400 further includes M1 layer interconnects 401, 404, 406, 408, 410, 412, and 473 configured in the M1 layer. As shown in FIG. 4, the M1 layer interconnects 401, 404, 406, 408, 410, 412, and 473 extend in the first direction. As further shown in FIG. 4, the M1 layer interconnect 404 extends along a track 480 in the first direction, and the M1 layer interconnect 410 extends along a track 490 in the first direction, where the track 480 is parallel to the track 490.

In an aspect, the M1 layer interconnects 401, 406, and 412 are formed using a first mask and are referred to as M1_A layer interconnects. In such aspect, the M1 layer interconnects 402, 404, 408, 410, and 473 are formed using a second mask and are referred to as M1_V layer interconnects. In the configuration of FIG. 4, the M1 layer interconnect 402 is coupled to the gate interconnect 414 through via (V0_MG) 428. The M1 layer interconnect 404 is coupled to the gate interconnect 416 through via (V0_MG) 430. The M1 layer interconnect 408 is coupled to the gate interconnect 418 through via (V0_MG) 432. The M1 layer interconnect 410 is coupled to the gate interconnect 420 through via (V0_MG) 434. The M1 layer interconnect 412 is coupled to the gate interconnect 424 through via (V0_MG) 436. Therefore, in FIG. 4, it should be understood that the vias (V0_MG) 428, 430, 432, 434, and 436 are situated above the POLY layer and below the M1 layer.

As shown in FIG. 4, the MOS device 400 further includes MD2 layer interconnects 443 and 471 configured in the MD2 layer. As shown in FIG. 4, the MD2 layer interconnects 443 and 471 extend in the second direction. In an aspect, the MD2 layer is situated below the M1 layer and above the POLY layer. As shown in FIG. 4, the MD2 layer interconnect 443 is coupled to the source (e.g., diffusion region 446) of transistor P1 and the drain (e.g., diffusion region 438) of transistor N1. The MD2 layer interconnect 443 may be coupled to the drain of transistor N1 (e.g., diffusion region 438) through an MD1_layer interconnect (e.g., MD1_layer interconnect 475). As further shown in FIG. 4, the MD2 layer interconnect 471 is coupled to the drain (e.g., diffusion region 449) of transistor P1 and the source (e.g., diffusion region 440) of transistor N1. As the diffusion region 449 is also the drain for the transistor P2, the MD2 layer interconnect 471 is also coupled to the drain (e.g., diffusion region 449) of transistor P2. As the diffusion region 440 is also the drain for the transistor N2, the MD2 layer interconnect 471 is also coupled to the drain (e.g., diffusion region 440) of transistor N2. The MD2 layer interconnect 471 is further coupled to the M1 layer interconnect 406 through via (V0_MD) 476. The MD2 layer interconnect 443 is coupled to the M1 layer interconnect 473 through via (V0_MD) 445. Referring again to the diffusion regions 453, 451, 457, and 455, the diffusion region 453 is the source of the transistor P3, the diffusion region 451 is the drain of the transistor P3 and the source of the transistor P2, the diffusion region 457 is the source of the transistor N3, and the diffusion region 455 is the drain of the transistor N3 and the source of the transistor N2.

In the aspect of FIG. 4, gate interconnect 414 is electrically isolated from gate interconnect 418 by configuring a single gate interconnect and by applying a cut mask portion 442. Moreover, the gate interconnect 416 is electrically isolated from gate interconnect 420 by configuring a single gate interconnect and by applying the cut mask portion 442. The cut mask portion 442 extending in the first direction is configured to cut the corresponding gate interconnects extending in the second direction, so as to effectively form multiple electrically isolated gate interconnects. Moreover, the M1 layer interconnect 402 is electrically isolated from the M1 layer interconnect 404 by configuring a single M1 layer interconnect and by applying a cut mask portion 444. The M1 layer interconnect 408 is electrically isolated from the M1 layer interconnect 410 by configuring a single M1 layer interconnect and by applying the cut mask portion 444. The cut mask portion 444 extending in the second direction is configured to cut corresponding M1 layer interconnects extending in the first direction, so as to effectively form multiple electrically isolated M1 layer interconnects.

In the example configuration of FIG. 4, an input value D (e.g., logic '1' or logic '0') may be provided to M1 layer interconnect 473. As shown in FIG. 4, the M1 layer interconnects 402 and 410 are configured to carry a clock signal (Clk), and the M1 layer interconnects 404 and 408 are configured to carry the inverse Clk of the clock signal. With reference to FIG. 2, the M1 layer interconnect 406 corresponds to the node PN1, and the M1 layer interconnect 412 corresponds to the node PN2.

As shown in FIG. 4, the area consumed on the MOS device may be represented in grid units, such as grid units 448, 450, 452, and 454. In the example configuration of FIG. 4, each of the grid units 448, 450, 452, and 454 indicates the spacing required between two adjacent gate interconnects. In an aspect, the grid units 448, 450, 452, and 454 are substantially equal. Moreover, each of the four grid units 448, 450, 452, and 454 in FIG. 4 may be substantially equal to each of the six grid units 350, 352, 354, 356, 358, and 360 in FIG. 3. With four grid units, there are four gate interconnects within the cell. The four gate interconnects include the gate interconnects 414/418, 416/420, and 424, and two half-width gate interconnects 422 and 426 on each side of the cell. When the cell is located next to an adjacent cell, the half-width gate interconnects 422 and 426 abut to adjacent half-width gate interconnects to form normal width gate interconnects (which may be utilized by a corresponding adjacent cell or may be dummy/unused gate interconnects). Therefore, since the MOS device 400 consumes four grid units (e.g., grid units 448, 450, 452, and 454) of area, the MOS device 400 in FIG. 4 performs the same functionality as the MOS device 300 while saving at least two grid units of area on a MOS device.

Figure 5:
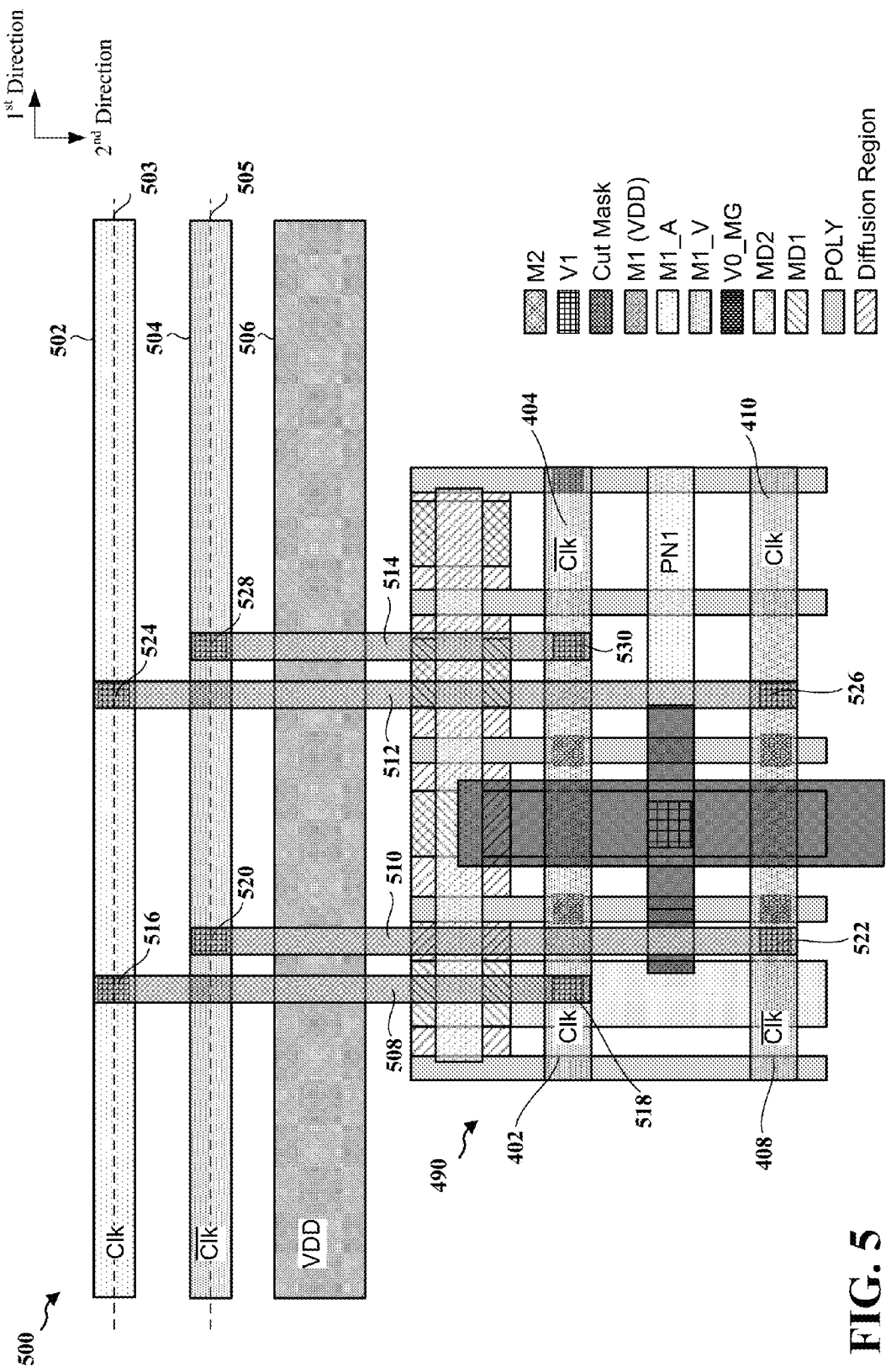
FIG. 5 is a top view of an exemplary layout diagram for a MOS device in accordance with various aspects of the disclosure.

FIG. 5 is a top view of an exemplary layout diagram for a MOS device 500 in accordance with various aspects of the disclosure. The MOS device 500 includes M1 layer interconnects 502, 504, and 506, metal 2 (M2) layer interconnects 508, 510, 512, and 514, and portion 490. It should be noted that the portion 490 in FIG. 5 corresponds to portion 490 indicated in FIG. 4. As shown in FIG. 5, the M1 layer interconnect 502 extends in the first direction along the track 503, and the M1 layer interconnect 504 extends in the first direction along the track 505. In an aspect, the M1 layer interconnect 502 may be configured to carry a clock signal (Clk) and the M1 layer interconnect 504 may be configured to carry the inverse Clk of the clock signal.

As shown in FIG. 5, a first set of interconnects 508 and 512 configured in the M2 layer situated above the M1 layer are respectively coupled to the M1 layer interconnects 402 and 410. The first set of interconnects 508 and 512 are respectively coupled to the M1 layer interconnects 402 and 410 using vias (V1) 516, 518, 524, and 526. As further shown in FIG. 5, a second set of interconnects 510 and 514 configured in the M2 layer are respectively coupled to the M1 layer interconnects 408 and 404. The second set of interconnects 510 and 514 are respectively coupled to the M1 layer interconnects 408 and 404 using vias (V1) 520, 522, 528, and 530. In an aspect, with reference to FIG. 1, the M1 layer interconnects 502 and 504 may be extended to provide the clock signal and the inverse $\overline{Clk}$ of the clock signal to a number of the single-row cells in the multi-bit flip-flop tray 100.

Referring again to FIGS. 1, 4, and 5, a multi-bit flip-flop tray 100 includes a plurality of bit flip-flops 104, 106, 108, 110, 112, 114, 116, and 118. As shown in FIG. 5, the clock Clk and inverse clock $\overline{Clk}$ may be provided to each bit flip-flop through the M1 layer interconnects 503 and 505, respectively, and through corresponding M2 layer interconnects 516, 524, 520, and 528. The M2 layer interconnects 516, 524, 520, and 528 may extend across the cell and across each of the bit flip-flop cells in the same column to provide the clock Clk and inverse clock $\overline{Clk}$ to the bit flip-flop cell. For example, assuming the MOS device 400 corresponds to the bit flip-flop cell 104, the M2 layer interconnects 516 and 524 may extend across the cell corresponding to the MOS device 400/bit flip-flop cell 104 and across each of the cells corresponding to the bit flip-flop cells 106, 108, and 110 in order to provide the clock Clk to each of the bit flip-flop cells 104, 106, 108, and 110. Further, the M2 layer interconnects 520 and 528 may extend across the cell corresponding to the MOS device 400/bit flip-flop cell 104 and across each of the cells corresponding to the bit flip-flop cells 106, 108, and 110 in order to provide the inverse clock $\overline{Clk}$ to each of the bit flip-flop cells 104, 106, 108, and 110. The M1 layer interconnects 502 and 504 are shown connected to a clock Clk and an inverse clock $\overline{Clk}$, respectively. However, the M1 layer interconnects 502 and 504 may be connected to an inverse clock $\overline{Clk}$ and a clock Clk, respectively. As shown in FIGS. 4, 5, the clock Clk and inverse clock $\overline{Clk}$ are cross-coupled, as the M1 layer interconnects 404 and 408, which are located diagonally from each other, are coupled together across the coupling of the M1 layer interconnects 402 and 410, and the M1 layer interconnects 402 and 410, which are located diagonally from each other, are coupled together across the coupling of the M1 layer interconnects 404 and 408. Each of the M1 layer interconnects 503, 505, 402, 410, 404, and 408 are unidirectional and extend in the same direction (e.g., first direction). The other M1 layer interconnects 401, 406, 412, and 473 are also unidirectional and extend in the same direction (e.g., first direction).

Referring again to FIGS. 4, 5, a MOS device includes a first interconnect 402 extending on a first track 480 in a first direction. The first interconnect 402 is configured in the M1 layer. The MOS device further includes a second interconnect 404 extending on the first track 480 in the first direction. The second interconnect 404 is configured in the M1 layer. The MOS device further includes a third interconnect 408 extending on a second track 490 in the first direction. The third interconnect 408 is configured in the M1 layer. The second track 490 is parallel to the first track 480. The MOS device further includes a fourth interconnect 410 extending on the second track 490 in the first direction. The fourth interconnect 410 is configured in the M1 layer. The first interconnect 402 is coupled to the fourth interconnect 410, and the second interconnect 404 is coupled to the third interconnect 408.

In one configuration, the MOS device further includes a first gate interconnect 414 extending on a third track 492 in a second direction orthogonal to the first direction. The first gate interconnect is situated in a POLY layer below the M1 layer. The MOS device further includes a second gate interconnect 418 extending on the third track 492 in the second direction. The second gate interconnect 418 is situated in the POLY layer. The MOS device further includes a third gate interconnect 416 extending on a fourth track 494 in the second direction. The third gate interconnect 416 is situated in the POLY layer. The fourth track 494 is parallel to the third track 492. The MOS device further includes a fourth gate interconnect 420 extending on the fourth track 494 in the second direction. The fourth gate interconnect 420 is situated in the POLY layer. In one configuration, the first interconnect 402 is coupled to the first gate interconnect 414, the second interconnect 404 is coupled to the third gate interconnect 416, the third interconnect 408 is coupled to the second gate interconnect 418, and the fourth interconnect 410 is coupled to the fourth gate interconnect 420.

In one configuration, the MOS device further includes a fifth interconnect 502 extending on a third track 503. The third track 503 is parallel to the first track 480 and the second track 490. The MOS device further includes a sixth interconnect 504 extending on a fourth track 505. The fourth track 505 is parallel to the third track 503. The fifth interconnect 502 is coupled to the first interconnect 402 and the fourth interconnect 410, and the sixth interconnect 504 is coupled to the second interconnect 404 and the third interconnect 408. In one configuration, the fifth interconnect 502 is coupled to the first interconnect 402 and the fourth interconnect 410 through a first set of interconnects 508, 512 configured in an M2 layer and extending in a second direction orthogonal to the first direction. In such a configuration, the sixth interconnect 504 is coupled to the second interconnect 404 and the third interconnect 408 through a second set of interconnects 514, 510 configured in the M2 layer and extending in the second direction.

In one configuration, the MOS device further includes a first pMOS transistor P1 including a first pMOS transistor gate, a first pMOS transistor source, and a first pMOS transistor drain; a second pMOS transistor P2 including a second pMOS transistor gate, a second pMOS transistor source, and a second pMOS transistor drain; a first nMOS transistor N1 including a first nMOS transistor gate, a first nMOS transistor source, and a first nMOS transistor drain; and a second nMOS transistor N2 including a second nMOS transistor gate, a second nMOS transistor source, and a second nMOS transistor drain. The first pMOS transistor gate 414 is coupled to the first interconnect 402, the second pMOS transistor gate 416 is coupled to the second interconnect 404, the first nMOS transistor gate 418 is coupled to the third interconnect 408, and the second nMOS transistor gate 420 is coupled to the fourth interconnect 410. In one configuration, the first pMOS transistor source 446 and the first nMOS transistor drain 438 are coupled together with an MD layer (e.g., MD2 layer) interconnect 443 extending in a second direction orthogonal to the first direction. In one configuration, the MOS device further includes a fifth interconnect 473 extending in the first direction on the M1 layer. The fifth interconnect 473 is coupled to the MD layer interconnect 443. The fifth interconnect 473 is configured to receive an input to the MOS device.

In one configuration, the first pMOS transistor drain 449 and the second pMOS transistor drain 449 are the same, and the first nMOS transistor source 440 and the second nMOS transistor drain 440 are the same. In one configuration, the first pMOS transistor drain and the second pMOS transistor drain 449 are coupled to the first nMOS transistor source and the second nMOS transistor drain 440 through an MD layer (e.g., MD2 layer) interconnect 471 extending in a second direction orthogonal to the first direction. In one configuration, the MOS device further includes a fifth interconnect 412 (PN2) extending in the first direction on the M1 layer. The fifth interconnect 412 is coupled to the MD layer interconnect 471. The fifth interconnect 412 is an output of the MOS device.

In one configuration, the MOS device further includes a third pMOS transistor P3 including a third pMOS transistor gate, a third pMOS transistor source, and a third pMOS transistor drain; and a third nMOS transistor N3 including a third nMOS transistor gate, a third nMOS transistor source, and a third nMOS transistor drain. The third pMOS transistor gate 424 and the third nMOS transistor gate 424 are formed from the same gate interconnect 424 extending in the first direction. In one configuration, the third pMOS transistor drain 451 and the second pMOS transistor source 451 are the same, and the third nMOS transistor drain 455 and the second nMOS transistor source 455 are the same. In one configuration, the third pMOS transistor source 453 is configured to be coupled to a first voltage source (e.g., VDD), and the third nMOS transistor source 457 is configured to be coupled to a second voltage source (e.g., VSS, which may be ground).

As shown in FIG. 4, the MOS device has a width of four grids. The first, second, third, and fourth interconnects 402, 404, 408, 410 are unidirectional interconnects. The first, second, third, and fourth interconnects 402, 404, 408, 410 are M1 layer interconnects.

Figure 6:
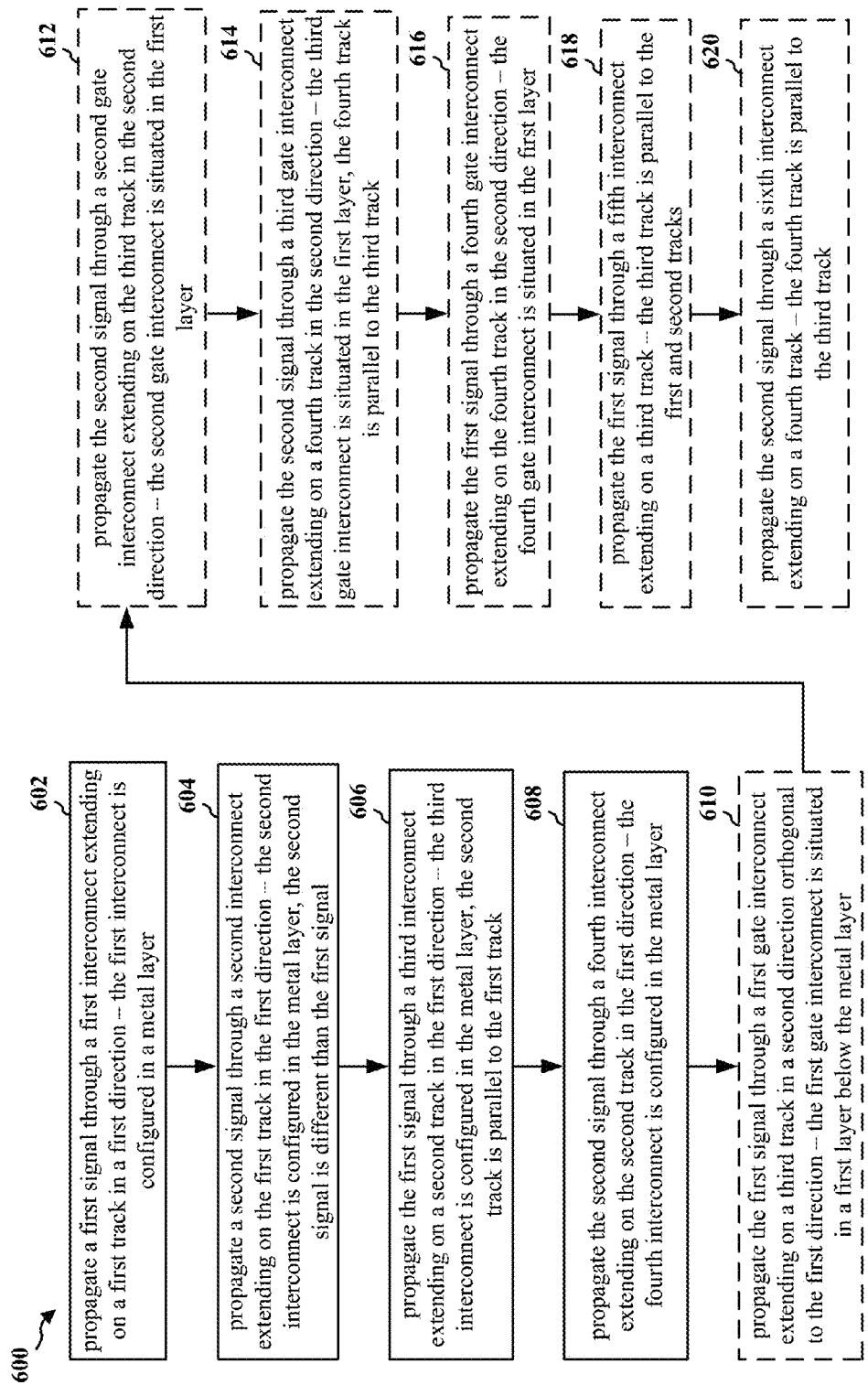
FIG. 6 is a flowchart of an exemplary method.

FIG. 6 is a flowchart 600 of an exemplary method. The exemplary method is a method of operation of a MOS device. It should be understood that the operations indicated with dotted lines in FIG. 6 represent optional operations.

At 602, a first signal is propagated through a first interconnect extending on a first track in a first direction, the first interconnect being configured in a metal layer. For example, with reference to FIG. 4, the first interconnect may be the M1 layer interconnect 402, the first track may be the track 480, and the first signal may be the clock Clk signal.

At 604, a second signal is propagated through a second interconnect extending on the first track in the first direction. The second interconnect is configured in the metal layer. The second signal is different than the first signal. For example, with reference to FIG. 4, the second interconnect may be the M1 layer interconnect 404, and the second signal may be the inverse clock Clk signal.

At 606, the first signal is propagated through a third interconnect extending on a second track in the first direction. The third interconnect is configured in the metal layer. The second track is parallel to the first track. For example, with reference to FIG. 4, the third interconnect may be the M1 layer interconnect 408 and the second track may be the track 490.

At 608, the second signal is propagated through a fourth interconnect extending on the second track in the first direction. The fourth interconnect is configured in the metal layer. For example, with reference to FIG. 4, the fourth interconnect may be the M1 layer interconnect 410. In an aspect, the first interconnect is coupled to the fourth interconnect, and the second interconnect is coupled to the third interconnect.

At 610, the first signal is propagated through a first gate interconnect extending on a third track in a second direction orthogonal to the first direction. The first gate interconnect is situated in a first layer below the metal layer. For example, with reference to FIG. 4, the first gate interconnect may be the POLY layer interconnect 414 and the third track may be the track 492.

At 612, the second signal is propagated through a second gate interconnect extending on the third track in the second direction. The second gate interconnect is situated in the first layer. For example, with reference to FIG. 4, the second gate interconnect may be the POLY layer interconnect 418.

At 614, the second signal is propagated through a third gate interconnect extending on a fourth track in the second direction. The third gate interconnect is situated in the first layer. The fourth track is parallel to the third track. For example, with reference to FIG. 4, the third gate interconnect may be the POLY layer interconnect 416 and the fourth track may be the track 494.

At 616, the first signal is propagated through a fourth gate interconnect extending on the fourth track in the second direction. The fourth gate interconnect is situated in the first layer. For example, with reference to FIG. 4, the fourth gate interconnect may be the POLY layer interconnect 420. In an aspect, the first interconnect is coupled to the first gate interconnect, the second interconnect is coupled to the third gate interconnect, the third interconnect is coupled to the second gate interconnect, and the fourth interconnect is coupled to the fourth gate interconnect.

At 618, the first signal is propagated through a fifth interconnect extending on a third track. The third track is parallel to the first and second tracks. For example, the fifth interconnect may be the M1 layer interconnect 502 and the third track may be the track 503.

At 620, the second signal is propagated through a sixth interconnect extending on a fourth track. The fourth track is parallel to the third track. For example, the sixth interconnect may be the M1 layer interconnect 504 and the third track may be the track 505. In an aspect, the fifth interconnect is coupled to the first and fourth interconnects, and the sixth interconnect is coupled to the second and third interconnects. In an aspect, the fifth interconnect is coupled to the first and fourth interconnects through a first set of interconnects configured in a second metal layer (e.g., M2) and extending in the second direction. For example, with reference to FIG. 5, the first set of interconnects may be the M2 layer interconnects 508 and 512. In such aspect, the sixth interconnect is coupled to the second and third interconnects through a second set of interconnects configured in the second metal layer and extending in the second direction. For example, with reference to FIG. 5, the second set of interconnects may be the M2 layer interconnects 510 and 514. In an aspect, the first, second, third, and fourth gate interconnects are configured in a POLY layer.

In an aspect, a MOS device includes first means for propagating a first signal, the first means (e.g., M1 layer interconnect 402) extending on a first track (e.g., track 480) in a first direction. The first means is configured in a metal layer (e.g., M1). The MOS device further includes second means (e.g., M1 layer interconnect 404) for propagating a second signal. The second means extends on the first track in the first direction. The second means is configured in the metal layer. The MOS device further includes third means (e.g., M1 layer interconnect 408) for propagating the first signal. The third means extends on a second track (e.g., track 490) in the first direction. The third means is configured in the metal layer. The second track is parallel to the first track. The MOS device further includes fourth means for propagating the second signal. The fourth means (e.g., M1 layer interconnect 410) extends on the second track in the first direction. The fourth means is configured in the metal layer. In an aspect, the first means is coupled to the fourth means, and the second means is coupled to the third means.

In an aspect, the MOS device further includes fifth means for propagating the first signal, the fifth means (e.g., gate interconnects 414) extending on a third track (e.g., track 492) in a second direction orthogonal to the first direction. The fifth means is situated in a first layer (e.g., POLY layer) below the metal layer. The MOS device further includes sixth means (e.g., gate interconnect 418) for propagating the second signal. The sixth means extends on the third track in the second direction. The sixth means is situated in the first layer. The MOS device further includes seventh means (e.g., gate interconnect 416) for propagating the second signal. The seventh means extends on a fourth track (e.g., track 494) in the second direction. The seventh means is situated in the first layer. The fourth track is parallel to the third track. The MOS device further includes eighth means (e.g., gate interconnect 420) for propagating the first signal. The eighth means extends on the fourth track in the second direction. The eighth means is situated in the first layer. In an aspect, the first means is coupled to the fifth means, the second means is coupled to the seventh means, the third means is coupled to the sixth means, and the fourth means is coupled to the eighth means.

In an aspect, the MOS device further includes fifth means for propagating the first signal. The fifth means (e.g., M1 layer interconnect 502) extends on a third track (e.g., track 503). The third track is parallel to the first and second tracks. The MOS device further includes sixth means (e.g., M1 layer interconnect 504) for propagating the second signal. The sixth means extends on a fourth track (e.g., track 505). The fourth track is parallel to the third track. In an aspect, the fifth means is coupled to the first and fourth means (e.g., M1 layer interconnects 402 and 410), and the sixth means is coupled to the second and third means (e.g., M1 layer interconnects 404 and 408).

In an aspect, the fifth means is coupled to the first and fourth means through a first set of interconnects configured in a second metal layer (e.g., M2) and extending in the second direction, and the sixth means is coupled to the second and third means through a second set of interconnects configured in the second metal layer (e.g., M2) and extending in the second direction. In an aspect, the fifth, sixth, seventh, and eighth means are configured in a POLY layer. In an aspect, the fifth, sixth, seventh, and eighth means are gate interconnects. In an aspect, the first, second, third, and fourth means are unidirectional interconnects. Specifically, in an aspect, the first, second, third, and fourth means are unidirectional M1 layer interconnects.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:
1. A metal oxide semiconductor (MOS) device, comprising:
   a first interconnect extending on a first track in a first direction, the first interconnect being configured in a metal layer;

a second interconnect extending on the first track in the first direction, the second interconnect being configured in the metal layer;

a third interconnect extending on a second track in the first direction, the third interconnect being configured in the metal layer, the second track being parallel to the first track, the third interconnect being coupled to the second interconnect, the second and third interconnects being configured to provide a first signal; and a fourth interconnect extending on the second track in the first direction, the fourth interconnect being configured in the metal layer, the fourth interconnect being coupled to the first interconnect, the first and fourth interconnects being configured to provide a second signal different than the first signal, wherein the first interconnect and the fourth interconnect are cross coupled across the coupling of the second interconnect and the third interconnect, and the second interconnect and the third interconnect are cross coupled across the coupling of the first interconnect and the fourth interconnect.

2. The MOS device of claim 1, wherein the first, second, third, and fourth interconnects are unidirectional interconnects.

3. The MOS device of claim 2, wherein the first, second, third, and fourth interconnects are metal one (M1) layer interconnects.

4. A metal oxide semiconductor (MOS) device, comprising:

a first interconnect extending on a first track in a first direction, the first interconnect being configured in a metal layer;

a second interconnect extending on the first track in the first direction, the second interconnect being configured in the metal layer;

a third interconnect extending on a second track in the first direction, the third interconnect being configured in the metal layer, the second track being parallel to the first track, the third interconnect being coupled to the second interconnect, the second and third interconnects being configured to provide a first signal; and a fourth interconnect extending on the second track in the first direction, the fourth interconnect being configured in the metal layer, the fourth interconnect being coupled to the first interconnect, the first and fourth interconnects being configured to provide a second signal different than the first signal, wherein the MOS device further comprises:

a first gate interconnect extending on a third track in a second direction orthogonal to the first direction, the first gate interconnect being situated in a first layer below the metal layer;

a second gate interconnect extending on the third track in the second direction, the second gate interconnect being situated in the first layer;

a third gate interconnect extending on a fourth track in the second direction, the third gate interconnect being situated in the first layer, wherein the fourth track is parallel to the third track; and a fourth gate interconnect extending on the fourth track in the second direction, the fourth gate interconnect being situated in the first layer.

5. The MOS device of claim 4, wherein:

the first interconnect is coupled to the first gate interconnect;

the second interconnect is coupled to the third gate interconnect;

the third interconnect is coupled to the second gate interconnect; and the fourth interconnect is coupled to the fourth gate interconnect.

6. A metal oxide semiconductor (MOS) device, comprising:

a first interconnect extending on a first track in a first direction, the first interconnect being configured in a metal layer;

a second interconnect extending on the first track in the first direction, the second interconnect being configured in the metal layer;

a third interconnect extending on a second track in the first direction, the third interconnect being configured in the metal layer, the second track being parallel to the first track, the third interconnect being coupled to the second interconnect, the second and third interconnects being configured to provide a first signal; and a fourth interconnect extending on the second track in the first direction, the fourth interconnect being configured in the metal layer, the fourth interconnect being coupled to the first interconnect, the first and fourth interconnects being configured to provide a second signal different than the first signal, wherein the MOS device of further comprises:

a fifth interconnect extending on a third track, the third track being parallel to the first and second tracks; and a sixth interconnect extending on a fourth track, the fourth track being parallel to the third track, wherein the fifth interconnect is coupled to the first and fourth interconnects, and wherein the sixth interconnect is coupled to the second and third interconnects.

7. The MOS device of claim 6, wherein the fifth interconnect is coupled to the first and fourth interconnects through a first set of interconnects configured in a second metal layer and extending in a second direction orthogonal to the first direction, and wherein the sixth interconnect is coupled to the second and third interconnects through a second set of interconnects configured in the second metal layer and extending in the second direction.

8. A metal oxide semiconductor (MOS) device, comprising:

a first interconnect extending on a first track in a first direction, the first interconnect being configured in a metal layer;

a second interconnect extending on the first track in the first direction, the second interconnect being configured in the metal layer;

a third interconnect extending on a second track in the first direction, the third interconnect being configured in the metal layer, the second track being parallel to the first track, the third interconnect being coupled to the second interconnect, the second and third interconnects being configured to provide a first signal; and a fourth interconnect extending on the second track in the first direction, the fourth interconnect being configured in the metal layer, the fourth interconnect being coupled to the first interconnect, the first and fourth interconnects being configured to provide a second signal different than the first signal, wherein the MOS device further comprises:

a first p-type MOS (pMOS) transistor comprising a first pMOS transistor gate, a first pMOS transistor source, and a first pMOS transistor drain;

a second pMOS transistor comprising a second pMOS transistor gate, a second pMOS transistor source, and a second pMOS transistor drain;

a first n-type MOS (nMOS) transistor comprising a first nMOS transistor gate, a first nMOS transistor source, and a first nMOS transistor drain;

a second nMOS transistor comprising a second nMOS transistor gate, a second nMOS transistor source, and a second nMOS transistor drain, wherein the first pMOS transistor gate is coupled to the first interconnect, the second pMOS transistor gate is coupled to the second interconnect, the first nMOS transistor gate is coupled to the third interconnect, and the second nMOS transistor gate is coupled to the fourth interconnect.

9. The MOS device of claim 6, wherein the first pMOS transistor source and the first nMOS transistor drain are coupled together with a metal diffusion (MD) layer interconnect extending in a second direction orthogonal to the first direction.

10. The MOS device of claim 9, further comprising a fifth interconnect extending in the first direction on the metal layer, the fifth interconnect being coupled to the MD layer interconnect, the fifth interconnect being configured to receive an input to the MOS device.

11. The MOS device of claim 8, wherein the first pMOS transistor drain and the second pMOS transistor drain are the same, and the first nMOS transistor source and the second nMOS transistor drain are the same.

12. The MOS device of claim 11, wherein the first pMOS transistor drain and the second pMOS transistor drain are coupled to the first nMOS transistor source and the second nMOS transistor drain through a metal diffusion (MD) layer interconnect extending in a second direction orthogonal to the first direction.

13. The MOS device of claim 12, further comprising a fifth interconnect extending in the first direction on the metal layer, the fifth interconnect being coupled to the MD layer interconnect, the fifth interconnect being an output of the MOS device.

14. The MOS device of claim 8, further comprising:
a third pMOS transistor comprising a third pMOS transistor gate, a third pMOS transistor source, and a third pMOS transistor drain; and
a third nMOS transistor comprising a third nMOS transistor gate, a third nMOS transistor source, and a third nMOS transistor drain,
wherein the third pMOS transistor gate and the third nMOS transistor gate are formed from a same gate interconnect extending in the first direction.

15. The MOS device of claim 14, wherein the third pMOS transistor drain and the second pMOS transistor source are the same, and the third nMOS transistor drain and the second nMOS transistor source are the same.

16. The MOS device of claim 14, wherein the third pMOS transistor source is configured to be coupled to a first voltage source, and the third nMOS transistor source is configured to be coupled to a second voltage source.

17. A metal oxide semiconductor (MOS) device, comprising:
a first interconnect extending on a first track in a first direction, the first interconnect being configured in a metal layer;
a second interconnect extending on the first track in the first direction, the second interconnect being configured in the metal layer;
a third interconnect extending on a second track in the first direction, the third interconnect being configured in the metal layer, the second track being parallel to the first track, the third interconnect being coupled to the second interconnect, the second and third interconnects being configured to provide a first signal; and
a fourth interconnect extending on the second track in the first direction, the fourth interconnect being configured in the metal layer, the fourth interconnect being coupled to the first interconnect, the first and fourth interconnects being configured to provide a second signal different than the first signal,
wherein the MOS device has a width of four grids.

18. A metal oxide semiconductor (MOS) device, comprising:
a first interconnect extending on a first track in a first direction, the first interconnect being configured in a metal layer;
a second interconnect extending on the first track in the first direction, the second interconnect being configured in the metal layer;
a third interconnect extending on a second track in the first direction, the third interconnect being configured in the metal layer, the second track being parallel to the first track, the third interconnect being coupled to the second interconnect, the second and third interconnects being configured to provide a first signal; and
a fourth interconnect extending on the second track in the first direction, the fourth interconnect being configured in the metal layer, the fourth interconnect being coupled to the first interconnect, the first and fourth interconnects being configured to provide a second signal different than the first signal,
wherein the second signal is an inverse of the first signal.

19. The MOS device of claim 18, wherein the second signal is a clock signal, and the first signal is an inverse clock signal.

20. A method of operation of a metal oxide semiconductor (MOS) device, comprising:
propagating a first signal through a first interconnect extending on a first track in a first direction, the first interconnect being configured in a metal layer;
propagating a second signal through a second interconnect extending on the first track in the first direction, the second interconnect being configured in the metal layer, the second signal being different than the first signal;
propagating the first signal through a third interconnect extending on a second track in the first direction, the third interconnect being configured in the metal layer, the second track being parallel to the first track, the third interconnect being coupled to the second interconnect; and
propagating the second signal through a fourth interconnect extending on the second track in the first direction, the fourth interconnect being configured in the metal layer, the fourth interconnect being coupled to the first interconnect,
wherein the first interconnect and the fourth interconnect are cross coupled across the coupling of the second interconnect and the third interconnect, and the second interconnect and the third interconnect are cross coupled across the coupling of the first interconnect and the fourth interconnect.

21. A method of operation of a metal oxide semiconductor (MOS) device, comprising:
propagating a first signal through a first interconnect extending on a first track in a first direction, the first interconnect being configured in a metal layer;
propagating a second signal through a second interconnect extending on the first track in the first direction, the second interconnect being configured in the metal layer, the second signal being different than the first signal;

propagating the first signal through a third interconnect extending on a second track in the first direction, the third interconnect being configured in the metal layer, the second track being parallel to the first track, the third interconnect being coupled to the second interconnect; and propagating the second signal through a fourth interconnect extending on the second track in the first direction, the fourth interconnect being configured in the metal layer, the fourth interconnect being coupled to the first interconnect, wherein the method further comprises:

propagating the first signal through a first gate interconnect extending on a third track in a second direction orthogonal to the first direction, the first gate interconnect being situated in a first layer below the metal layer;

propagating the second signal through a second gate interconnect extending on the third track in the second direction, the second gate interconnect being situated in the first layer;

propagating the second signal through a third gate interconnect extending on a fourth track in the second direction, the third gate interconnect being situated in the first layer, wherein the fourth track is parallel to the third track; and propagating the first signal through a fourth gate interconnect extending on the fourth track in the second direction, the fourth gate interconnect being situated in the first layer.

22. The method of claim 21, wherein:

the first interconnect is coupled to the first gate interconnect;

the second interconnect is coupled to the third gate interconnect;

the third interconnect is coupled to the second gate interconnect; and the fourth interconnect is coupled to the fourth gate interconnect.

23. A method of operation of a metal oxide semiconductor (MOS) device, comprising:

propagating a first signal through a first interconnect extending on a first track in a first direction, the first interconnect being configured in a metal layer;

propagating a second signal through a second interconnect extending on the first track in the first direction, the second interconnect being configured in the metal layer, the second signal being different than the first signal;

propagating the first signal through a third interconnect extending on a second track in the first direction, the third interconnect being configured in the metal layer, the second track being parallel to the first track, the third interconnect being coupled to the second interconnect; and propagating the second signal through a fourth interconnect extending on the second track in the first direction, the fourth interconnect being configured in the metal layer, the fourth interconnect being coupled to the first interconnect, wherein the method further comprises:

propagating the first signal through a fifth interconnect extending on a third track, the third track being parallel to the first and second tracks; and propagating the second signal through a sixth interconnect extending on a fourth track, the fourth track being parallel to the third track, wherein the fifth interconnect is coupled to the first and fourth interconnects, and wherein the sixth interconnect is coupled to the second and third interconnect.

24. The method of claim 23, wherein the fifth interconnect is coupled to the first and fourth interconnects through a first set of interconnects configured in a second metal layer and extending in a second direction orthogonal to the first direction, and wherein the sixth interconnect is coupled to the second and third interconnects through a second set of interconnects configured in the second metal layer and extending in the second direction.

25. A metal oxide semiconductor (MOS) device, comprising:

first means for propagating a first signal, the first means extending on a first track in a first direction, the first means being configured in a metal layer;

second means for propagating a second signal, the second means extending on the first track in the first direction, the second means being configured in the metal layer, the second signal being different than the first signal;

third means for propagating the first signal, the third means extending on a second track in the first direction, the third means being configured in the metal layer, wherein the second track is parallel to the first track, the third means being coupled to the second means; and fourth means for propagating the second signal, the fourth means extending on the second track in the first direction, the fourth means being configured in the metal layer, the fourth means being coupled to the first means, wherein the first means and the fourth means are cross coupled across the coupling of the second means and the third means, and the second means and the third means are cross coupled across the coupling of the first means and the fourth means.

26. The MOS device of claim 25, wherein the first, second, third, and fourth means are unidirectional interconnects.

27. A metal oxide semiconductor (MOS) device, comprising:

first means for propagating a first signal, the first means extending on a first track in a first direction, the first means being configured in a metal layer:

second means for propagating a second signal, the second means extending on the first track in the first direction, the second means being configured in the metal layer, the second signal being different than the first signal;

third means for propagating the first signal, the third means extending on a second track in the first direction, the third means being configured in the metal layer, wherein the second track is parallel to the first track, the third means being coupled to the second means; and fourth means for propagating the second signal, the fourth means extending on the second track in the first direction, the fourth means being configured in the metal layer, the fourth means being coupled to the first means, wherein the MOS device, further comprises:

fifth means for propagating the first signal, the fifth means extending on a third track in a second direction orthogonal to the first direction, the fifth means being situated in a first layer below the metal layer;

sixth means for propagating the second signal, the sixth means extending on the third track in the second direction, the sixth means being situated in the first layer;

seventh means for propagating the second signal, the seventh means extending on a fourth track in the second direction, the seventh means being situated in the first layer, wherein the fourth track is parallel to the third track; and eighth means for propagating the first signal, the eighth means extending on the fourth track in the second direction, the eighth means being situated in the first layer.

28. The MOS device of claim 27, wherein:
the first means is coupled to the fifth means;
the second means is coupled to the seventh means;
the third means is coupled to the sixth means; and
the fourth means is coupled to the eighth means.

29. A metal oxide semiconductor (MOS) device, comprising:

first means for propagating a first signal, the first means extending on a first track in a first direction, the first means being configured in a metal layer;

second means for propagating a second signal, the second means extending on the first track in the first direction, the second means being configured in the metal layer, the second signal being different than the first signal;

third means for propagating the first signal, the third means extending on a second track in the first direction, the third means being configured in the metal layer, wherein the second track is parallel to the first track, the third means being coupled to the second means; and fourth means for propagating the second signal, the fourth means extending on the second track in the first direction, the fourth means being configured in the metal layer, the fourth means being coupled to the first means, wherein the MOS device, further comprises:
fifth means for propagating the first signal, the fifth means extending on a third track, the third track being parallel to the first and second tracks; and sixth means for propagating the second signal, the sixth means extending on a fourth track, the fourth track being parallel to the third track, wherein the fifth means is coupled to the first and fourth means, and wherein the sixth means is coupled to the second and third means.

30. The MOS device of claim 29, wherein the fifth means is coupled to the first and fourth means through a first set of interconnects configured in a second metal layer and extending in a second direction orthogonal to the first direction, and wherein the sixth means is coupled to the second and third means through a second set of interconnects configured in the second metal layer and extending in the second direction.

\* \* \* \* \*